(12) United States Patent
Pan

(10) Patent No.: US 6,847,582 B2
(45) Date of Patent: Jan. 25, 2005

(54) LOW SKEW CLOCK INPUT BUFFER AND METHOD

(75) Inventor: Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/387,150

(22) Filed: Mar. 11, 2003

(65) Prior Publication Data

US 2004/0178824 A1 Sep. 16, 2004

(51) Int. Cl.$^7$ ............................. G11C 8/00; H03K 19/00
(52) U.S. Cl. ............................ 365/233; 326/93; 326/98; 327/291; 327/295
(58) Field of Search ................... 365/189.05, 233; 326/93, 98; 327/291, 295, 165, 170

(56) References Cited

U.S. PATENT DOCUMENTS

| | | | |
|---|---|---|---|
| 5,327,394 A | 7/1994 | Green et al. | 365/233 |
| 5,369,640 A | 11/1994 | Watson et al. | 371/1 |
| 5,684,424 A | 11/1997 | Felix et al. | 327/293 |
| 5,717,729 A | 2/1998 | Iknaian et al. | 375/356 |
| 5,903,174 A | 5/1999 | Landry et al. | 327/162 |
| 5,910,920 A | 6/1999 | Keeth | 365/189.05 |
| 5,936,893 A | 8/1999 | Merritt | 365/189.05 |
| 5,959,481 A | 9/1999 | Donnelly et al. | 327/170 |
| 5,999,032 A | 12/1999 | Wang et al. | 327/292 |
| 6,023,181 A | 2/2000 | Penny et al. | 327/291 |
| 6,049,241 A | 4/2000 | Brown et al. | 327/295 |
| 6,212,126 B1 * | 4/2001 | Sakamoto | 365/233 |
| 6,222,411 B1 * | 4/2001 | Chu et al. | 327/295 |
| 6,243,797 B1 | 6/2001 | Merritt | 711/167 |
| 6,300,807 B1 | 10/2001 | Miyazaki et al. | 327/158 |
| 6,331,793 B1 | 12/2001 | Fletcher et al. | 327/392 |
| 6,339,346 B1 * | 1/2002 | Jones, Jr. | 326/93 |
| 6,385,709 B2 | 5/2002 | Merritt | 711/167 |
| 6,392,453 B1 | 5/2002 | Morzano et al. | 327/108 |
| 6,392,466 B1 | 5/2002 | Fletcher | 327/392 |
| 6,407,588 B1 * | 6/2002 | Baker | 327/55 |
| 6,411,140 B1 | 6/2002 | Landry | 327/141 |
| 6,430,696 B1 | 8/2002 | Keith | 713/503 |
| 6,489,824 B2 | 12/2002 | Miyazaki et al. | 327/158 |
| 6,529,571 B1 | 3/2003 | Gaudet | 375/363 |
| 6,542,552 B1 | 4/2003 | Yoshikawa et al. | 375/257 |
| 6,552,953 B2 | 4/2003 | Blodgett | 365/233 |
| 6,636,110 B1 * | 10/2003 | Ooishi et al. | 327/565 |
| 6,662,304 B2 | 12/2003 | Keeth et al. | 713/400 |
| 6,675,313 B2 | 1/2004 | Cuthbert | 713/503 |
| 6,714,462 B2 | 3/2004 | Pan | 365/189.05 |

* cited by examiner

*Primary Examiner*—Son Mai
(74) *Attorney, Agent, or Firm*—Dorsey & Whitney, LLP

(57) ABSTRACT

An input buffer includes first and second cross-coupled differential amplifiers. Each amplifier drives a buffer signal from a first logic state to a second logic state at a first slew rate when input signal transitions from a first logic state to a second logic state and a complementary input signal transitions from the second logic state to the first logic state, and drives the buffer signal from the second logic state to the first logic state at a second slew rate when the signal transitions are the complement of these previous transitions. An output circuit generates a first edge of an output signal when the buffer signal from the first amplifier transitions from the first logic state to the second logic state and generates a second edged of the output signal when the buffer signal from the second amplifier transitions from the first to the second logic state.

43 Claims, 7 Drawing Sheets

LOW SKEW CLOCK INPUT BUFFER AND METHOD

TECHNICAL FIELD

This invention relates generally to digital circuits, and, more particularly, to the timing and characteristics input signals applied to an integrated circuit and the timing and characteristics of internal signals generated in the integrated circuit in response to the applied input signals.

BACKGROUND OF THE INVENTION

Input buffers are commonly used in a wide variety of digital circuits. There are also several types of input buffers. For example, there are single ended input buffers in which a single input signal is applied to the buffer to cause the buffer to transition when the input signal transitions through predetermined voltage levels. Single-ended input buffers may also compare the input signal to a reference voltage so the output of the input buffer transitions when the input signal transitions through the reference voltage. There are also complementary input buffers in which a pair of complementary signals cause the output of the buffer to transition when one of the input signals transitions through the level of the other input signal.

These types of input buffers generally perform a number of advantageous functions when used in digital circuits, such as providing a high input impedance to avoid unduly loading signal lines coupled to their inputs and conditioning signals applied to internal circuits so that internal signals have well defined logic levels and transition characteristics. Although input buffers can provide a number of advantages, they are not without limitations and disadvantages. For example, in high speed digital circuitry delays in propagating digital signals through input buffers can result in undesirable skew between an input signal applied to the buffer and an output signal from the buffer developed in response to the input signal.

Another problem that can occur with input buffers receiving complementary input signals is known as "duty cycle skew," which is a difference between a duty cycle of the input signals applied to the buffer and an output signal generated by the buffer in response to the input signals, as will be appreciated by those skilled in the art. This type of input buffer may be formed from N-type and P-type differential amplifiers, each receiving the complementary input signals. The output of each differential amplifiers is applied to an inverter which, in response to the output from either the N-type or P-type differential amplifier, generates an output signal.

Ideally, the duty cycle skew between the input and output signals is not affected by the voltage levels and slew rates of the input signals. In an actual input buffer, however, this may not be the case. For example, due to process, voltage, or temperature variations, the "switch point" of the inverter may vary, where the switch point is the voltage level at which the inverter drives the output signal in response to the output from one of the differential amplifiers. Such a variation in the switch point of the inverter can increase the duty cycle skew introduced by the buffer, as illustrated in the signal timing diagram of FIG. 1 CLK. In FIG. 1, the top signal CLK represents the input signal applied to the buffer, the next signal down CLK1 represents the output signals from the differential amplifiers, the next signal down OCLKI represents the ideal output signal from the inverter, and the bottom signal OCLKA represents the actual output signal from the inverter. When the inverter has a first switch point SWP1, the output signal from the inverter corresponds to the ideal output signal OCLKI, and if the inverter has a second switch point SWP2 the output signal corresponds to the actual output signal OCLKA. FIG. 1 illustrate the input signal CLK and ideal output signal OCLKI having respective duty cycles defined by a time T0 while the actual output signal OCLKA has a different duty cycle defined by times T1 and T2.

There is therefore a need for an input buffer that introduces a relatively small amount of duty cycle skew, operates at a fast rate of speed, and that can be readily adapted for use as an input buffer in a wide variety of circuits and applications.

SUMMARY OF THE INVENTION

According to one aspect of the present invention, an input buffer includes first and second cross-coupled differential amplifiers. Each differential amplifier has positive and negative inputs, and drives a buffer signal from a first logic state to a second logic state at a first slew rate when an input signal transitions from a first logic state to a second logic state and the complementary input signal transitions from the second logic state to the first logic state. Each differential amplifier drives the buffer signal from the second logic state to the first logic state at a second slew rate when the input signal transitions from the second logic state to the first logic state and the complementary input signal transitions from the first logic state to the second logic state. An output circuit is coupled to the outputs of the first and second differential amplifiers and generates a first edge of an output signal responsive to the buffer signal from the first differential amplifier transitioning from the first logic state to the second logic state and generates a second edge of an output signal responsive to the buffer signal from the second differential amplifier transitioning from the first logic state to the second logic state.

DETAILED DESCRIPTION OF THE INVENTION

Figure 2:
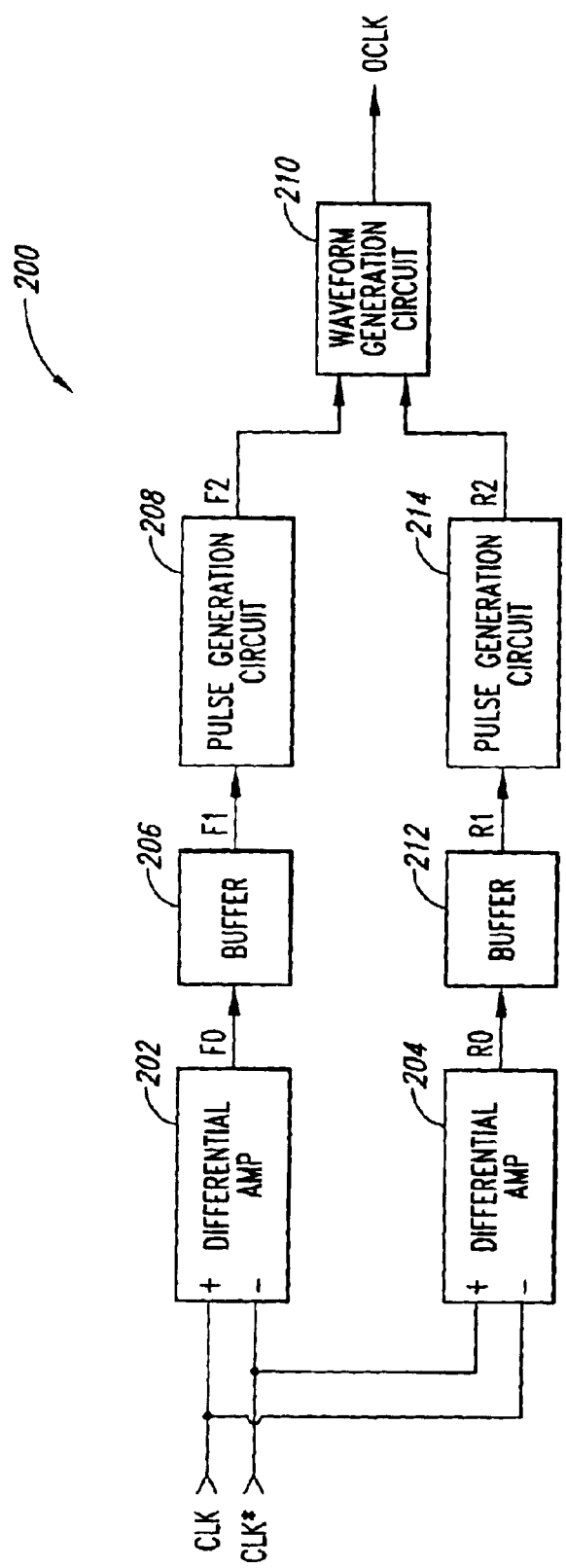
FIG. 2 is a functional block diagram illustrating a differential input buffer according to one embodiment of the present invention.

FIG. 2 is a functional block diagram illustrating a differential input buffer 200 according to one embodiment of the present invention. The differential input buffer 200 includes a pair of differential amplifiers 202 and 204 that generate output signals F0 and R0, respectively, in response to a pair of complementary clock signals CLK and CLK* applied on positive and negative inputs of each amplifier. Each differential amplifier 202, 204 operates in a conventional manner to generate the corresponding output signal F0, R0 in response to the voltage across the positive and negative inputs. Note that the complementary clock signals CLK, CLK* are applied to opposite inputs for the differential amplifiers 202 and 204, with the CLK signal being applied to the positive input of amplifier 202 and negative inputs of empire 204 and the CLK* signal being applied to the negative inputs of amplifier 204. By using two differential amplifiers 202 and 204 coupled in this manner, a particular edge of each output signal F0, R0 may be utilized in the buffer 200 to generate an output clock signal OCLK having low duty cycle skew relative to the applied clock signals CLK, CLK*, as will be described in more detail below.

In the following description, certain details are set forth to provide a sufficient understanding of the present invention, but one skilled in the art will appreciate that the invention may be practiced without these particular details. Furthermore, one skilled in the art will appreciate that the example embodiment described below does not limit the scope of the present invention, and will also understand that various modifications, equivalents, and combinations of the disclosed example embodiment and components of such embodiment are within the scope of the present invention. Illustrative examples presented below are intended only to further illustrate certain details of the various embodiments, and should not be interpreted as limiting the scope of the present invention. Finally, in other instances below, the operation of well known components has not been shown or described in detail to avoid unnecessarily obscuring the present invention.

The differential input buffer 200 further includes a buffer 206 that receives the signal F0 from the differential amplifier 202 and generates an output signal F1 in response to the signal F0. As will become apparent from the description below, in FIG. 2 the signals starting with an "F" are designated as such because these signals are utilized in generating a falling edge of the output clock signal OCLK, while signals starting with an "R" are utilized in generating a rising edge of the output clock signal. A pulse generation circuit 208 generates a pulse signal F2 in response to a falling edge of the signal F1 from the buffer 206. In response to the pulse signal F2 from the pulse generation circuit 208, a waveform generation circuit 210 generates a falling edge of the output clock signal OCLK.

The differential input buffer 200 further includes a buffer 212 that receives the signal R0 from the differential amplifier 204 and generates an output signal R1 in response to the signal R0. A pulse generation circuit 214 generates a pulse signal R2 in response to a falling edge of the signal R1 from the buffer 206. In response to the pulse signal R2 from the pulse generation circuit 214, the waveform generation circuit 210 generates a rising edge of the output clock signal OCLK. As seen from this description, the differential input buffer 200 utilizes the signals R0, R1, and R2 in generating the rising edge of the output clock signal OCLK. Duplicate components in the differential input buffer 200, namely the differential amplifiers 202, 204, buffers 206, 212, and pulse generation circuits 208, 214, would typically be formed from identical circuitry and thus have substantially the same electrical characteristics.

Figure 3:
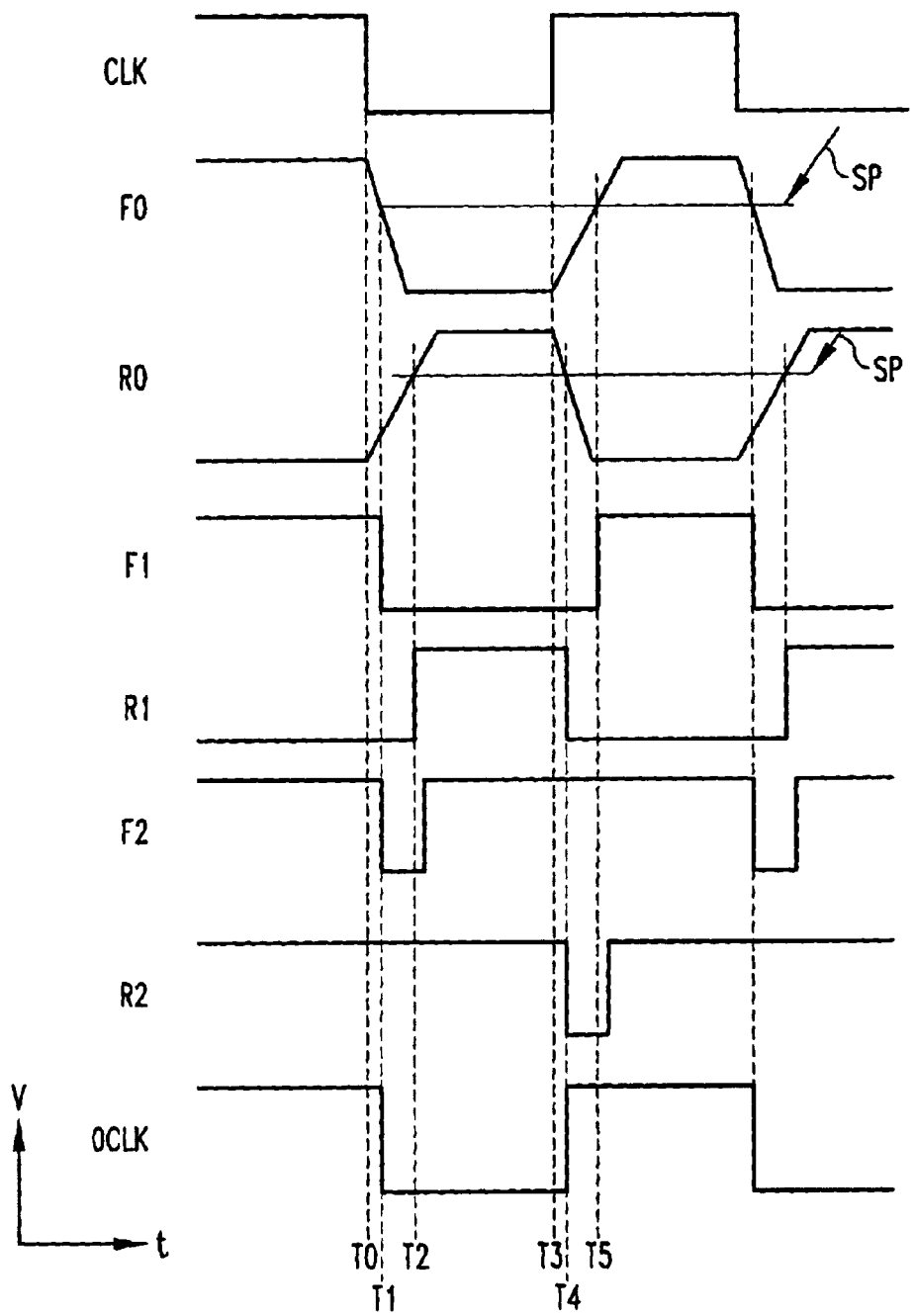
FIG. 3 is a signal timing diagram illustrating various signals in the differential input buffer of FIG. 2 as a function of time.

The overall operation of the differential input buffer 200 will now be described in more detail with reference to the signal timing diagram of FIG. 3, which illustrates various signals in the differential input buffer as a function of time. The vertical axis in FIG. 3 represents the voltages of the various signals while the horizontal axis represents time. In operation, the complementary clock signals CLK, CLK* are applied to the differential amplifiers 202, 204, with only the CLK signal being show in FIG. 2. Initially, the CLK signal is shown as being high, causing the differential amplifiers 202 and 204 to drive the signals F0 and R0 high and low, respectively, as illustrated. In response to a first falling edge of the CLK signal at a time T0, the differential amplifier 202 drives the signal F0 low and the differential amplifier 204 drives the signal R0 high. The rate at which the differential amplifier 202 drives the signal F0 low is determined by a falling edge slew rate of the differential amplifier, and the rate at which the differential amplifier 204 drives the signal R0 high is determined by a rising edge slew rate of the differential amplifier. Although the differential amplifiers 202, 204 are typically formed from identical circuitry (not shown in FIG. 2) and will thus have approximately the same rising edge and falling edge slew rates, the rising edge slew rates of each amplifier are typically not equal to the falling edge slew rates, as will be appreciated by those skilled in the art The differential amplifiers 202 and 204 operate inversely to one another since the CLK and CLK* signals are inversely applied to the inputs of the amplifiers, namely the CLK signal is applied to the positive input of the amplifier 202 and the negative input of the amplifier 204 and the CLK* signal applied to the negative input of the amplifier 202 and the positive input of the amplifier 204. As a result, in response to a rising edge of the CLK signal and a falling edge of the complementary CLK* signal, the differential amplifier 202 drives the F0 signal high while the differential amplifier 204 drives the R0 signal low. Conversely, in response to a falling edge of the CLK signal and a rising edge of the complementary CLK* signal, the differential amplifier 202 drives the F0 signal low while the differential amplifier 204 drives the R0 signal high.

In response to the falling edge of the F0 signal, the buffer 206 drives the F1 signal low at a time T1 once the F0 signal reaches a switch point SP of the buffer. The falling edge slew rate of the differential amplifier 202 determines when the signal F0 reaches the switch point SP of the buffer 206, and thus determines the interval T0–T1. Note that FIG. 3 does not illustrate delays between the input and output signals of the buffers 206, 212, pulse generation circuits 208, 214, or waveform generation circuit 210, and thus does not show the inherent delays introduced by these components. In response to the falling edge of the F1 signal at the time T1, the pulse generation circuit 208 applies a low pulse signal F2 to the waveform generation circuit 210 which, in turn, generates a first falling edge of the output clock signal OCLK at the time T1.

In response to the rising edge of the signal R0, the buffer 212 drives the signal R1 high at a time T3 once the R1 signal reaches a switch point SP of the buffer. The rising edge slew rate of the differential amplifier 204 determines when the signal R0 Teaches the switch point SP of the buffer 212. As seen in FIG. 3, the rising edge slew rate of the differential amplifier 204 is lower than the falling edge slew rate of the differential empire 202, causing the R0 signal to reach the switch point SP of the buffer 206 at the time T3 after the time T2. The pulse generation circuit 214 does not generate the pulse signal R2 in response to the rising edge of the R1 signal at the time T3 but only generates the pulse signal responsive to falling edges of the R1 signal.

At a time T3, a rising edge of the CLK signal and a falling edge of the CLK* signal (not shown in FIG. 3) is applied to the differential amplifiers 202, 204. In response to the CLK, CLK* signals, the differential amplifier 202 begins driving the F0 signal high and the differential amplifier 204 begins driving the R0 signal low. The buffer 212, in response to the falling edge of the R0 signal buffer 212, drives the R1 signal low at a time T4 once the R0 signal reaches the switch point SP of the buffer. In response to the falling edge of the R1 signal at the time T4, the pulse generation circuit 214 applies a low pulse signal R2 to the waveform generation circuit 210 which, in turn, generates a first rising edge of the output clock signal OCLK at the time T1. In response to the rising edge of the signal F0, the buffer 206 drives the signal F1 high at a time T5 once the F1 signal reaches the switch point SP of the buffer. The pulse generation circuit 208 does not generate the pulse signal F2 in response to the rising edge of the F1 signal at the time T5 but only generates the pulse signal responsive to falling edges of the F1 signal. The differential input buffer 200 thereafter operates in the same manner in response to subsequent rising and falling edges of the applied CLK and CLK* signals to generate corresponding rising and falling edges of the output clock signal OCLK.

As seen from the signal timing diagram of FIG. 3, the differential amplifier 202 develops a falling edge of the F0 signal in response to each falling edge of the CLK signal, and this falling edge of the F0 signal is utilized to generate a corresponding falling edge of the OCLK signal. Similarly, the differential amplifier 204 develops a falling edge of the R0 signal in response to each rising edge of the CLK signal, and this falling edge of the R0 signal is utilized to generate a corresponding rising edge of the OCLK signal. In this way, one of the differential amplifiers 202, 204 generates a falling edge signal F0, R0 in response to each edge of the applied CLK, CLK* signals. The falling edge signal from each differential amplifier 202, 204 is then used in generating the OCLK signal. Because the falling edge slew rates of the differential amplifiers 202, 204 are substantially equal, no duty cycle skew of the OCLK signal is caused by the differential amplifiers.

The structure of the differential input buffer 200 also eliminates any duty cycle skew that may be introduced by varying switch points SP of the buffers 206, 212. As previously described, in a conventional input buffer a change in the switch point SP of the output buffer or inverter causes duty cycle skew. With the differential input buffer 200, however, any variations in the switch points SP of the buffers 206, 212 as a function of process, the voltage, or temperature cancel each other and do not increase the duty cycle skew of the OCLK signal. This will now be explained in more detail with reference to FIG. 3. If the switch point SP of the buffer 206 decreases, the falling edges of the signals F1 and F2 will be delayed and thus will shift from the time T1 to the right towards the time T2. At this point, if the switch point SP of the buffer 212 remained the same, duty cycle skew of the OCLK signal would result. Because the buffers 206 and 212 are identical, however, the same decrease in a switch point SP of the buffer 212 occurs, causing the falling edges of the signals R1 and R2 to the delayed by the same amount and thus shifting these edges from the time T4 to the right towards the time T5. As a result, the skew of the OCLK signal relative to CLK varies, but the duty cycle skew does not.

One skilled in the art will appreciate that although in the differential input buffer 200 the falling edges of the F0, R0 signals from the differential amplifiers 202, 204 are utilized in generating corresponding edges of the OCLK signal, either edge of the F0, R0 signals could be utilized. Thus, in another embodiment the rising edges of the F0, R0 signals may be utilized by the pulse generation circuits 208, 214 to generate the corresponding pulse signals F2, R2.

Figure 4:
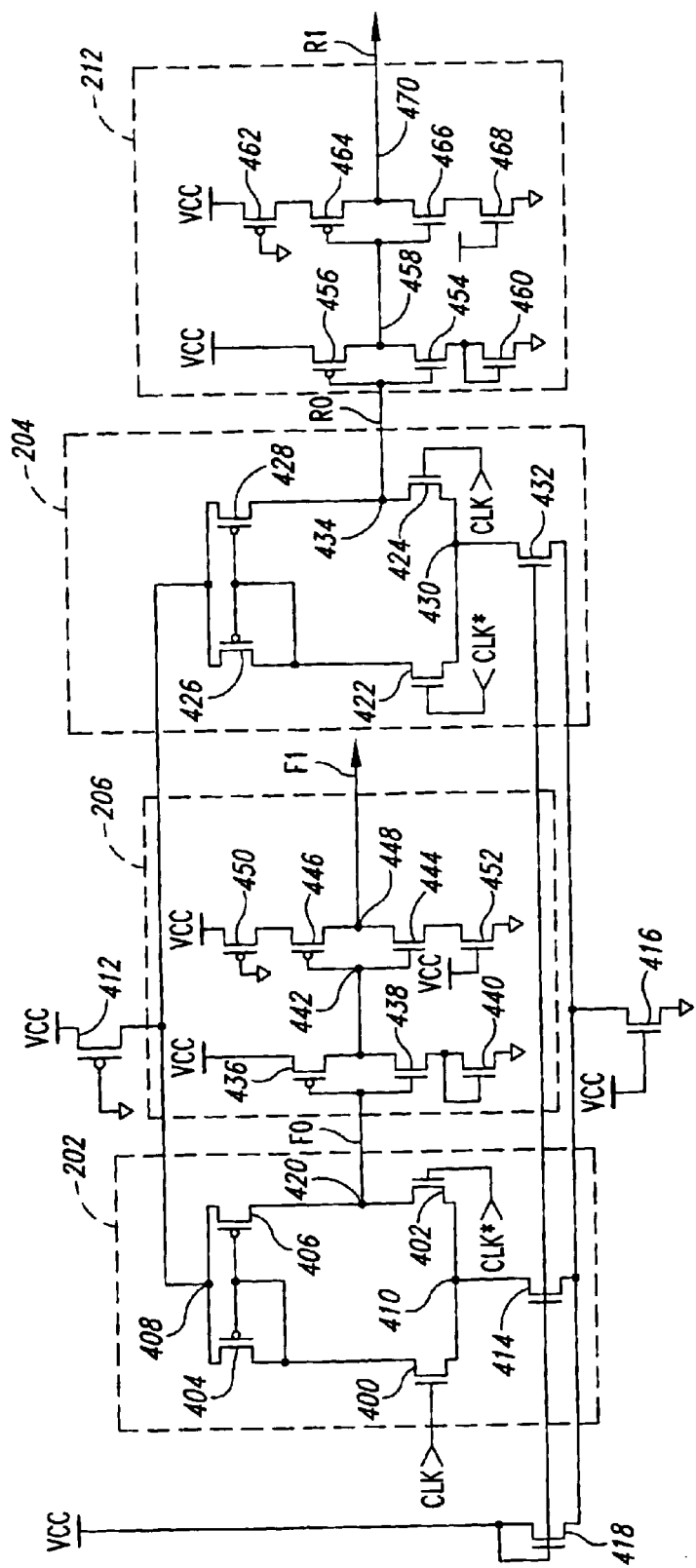
FIG. 4 is a schematic illustrating one embodiment of the differential amplifiers and buffer circuitry in the differential input buffer of FIG. 2.

FIG. 4 is a schematic illustrating one embodiment of the differential amplifiers 202, 204 and buffers 206, 212 of FIG. 2. The differential amplifier 202 includes a pair of NMOS transistors 400, 402 that receive the CLK and CLK* signals, respectively, along with a diode-coupled PMOS transitor 404 and a PMOS transistor 406 coupled between a supply voltage node 408 and a reference voltage node 410 as shown. A supply voltage VCC supplies a constant current through a transistor 412 to charge the node 408, and a constant current discharges the node 410 through NMOS transistors 414 and 416. A diode-coupled NMOS transistor 418 is coupled to the NMOS transistor 414, with the two transistors functioning as a constant current to set the current through the transistor 414 to a desired value. In operation, when the CLK and CLK* signals are high and low, respectively, the transistor 402 turns OFF and the transistor 400 turns ON, driving the gate of transistor 408 low. The transistor 408 turns ON in response to this low gate voltage, driving the signal F0 on an output node 418 high. Conversely, when the CLK and CLK* signals are low and high, respectively, the transistor 400 turns OFF, causing the transistors 404, 406 to turn OFF, and the transistor 402 turns ON to thereby drive the signal F0 on the output node 418 low.

The differential amplifier 204 includes components 422–434 that are coupled and function in the same way as the corresponding components 400–420 in the differential amplifier 202. Thus, for the sake of brevity, the structure and operation of differential amplifier 204 will not be described in more detail. Note that in the differential amplifier 204 the transistors 422 and 424 receive the signals CLK* and CLK, respectively, which is the opposite of the corresponding transistors 400 and 402 in the differential amplifier 202.

The buffer 206 includes a first stage formed by a PMOS transistor 436, NMOS transistor 438, and diode-coupled transistor 440 coupled in series between the supply voltage VCC and ground. The transistors 436 and 438 operate as a conventional inverter in response to the F0 signal to develop an inverted signal on an output node 442, with the transistor 440 functioning as a level shifter to shift the low level of the inverted signal. A second stage of the buffer 206 includes an NMOS transistor 444 and a PMOS transistor 446 that operate as in a conventional inverter to develop the F1 signal on an output node 448 in response to the F0 signal. An NMOS transistor 450 and PMOS transistor 452 function to set the current through the transistors 446 and 448, respectively, during operation of the second stage. In operation, the first and second stages operate to develop the F1 signal responsive to the F0 signal, as will be understood by those skilled in the art The buffer 212 includes components 454–470 that are coupled and function in the same way as the corresponding components 4436–452 in the buffer 206, and thus, for the sake of brevity, the structure and operation of the buffer 212 will not be described in more detail.

Figure 5:
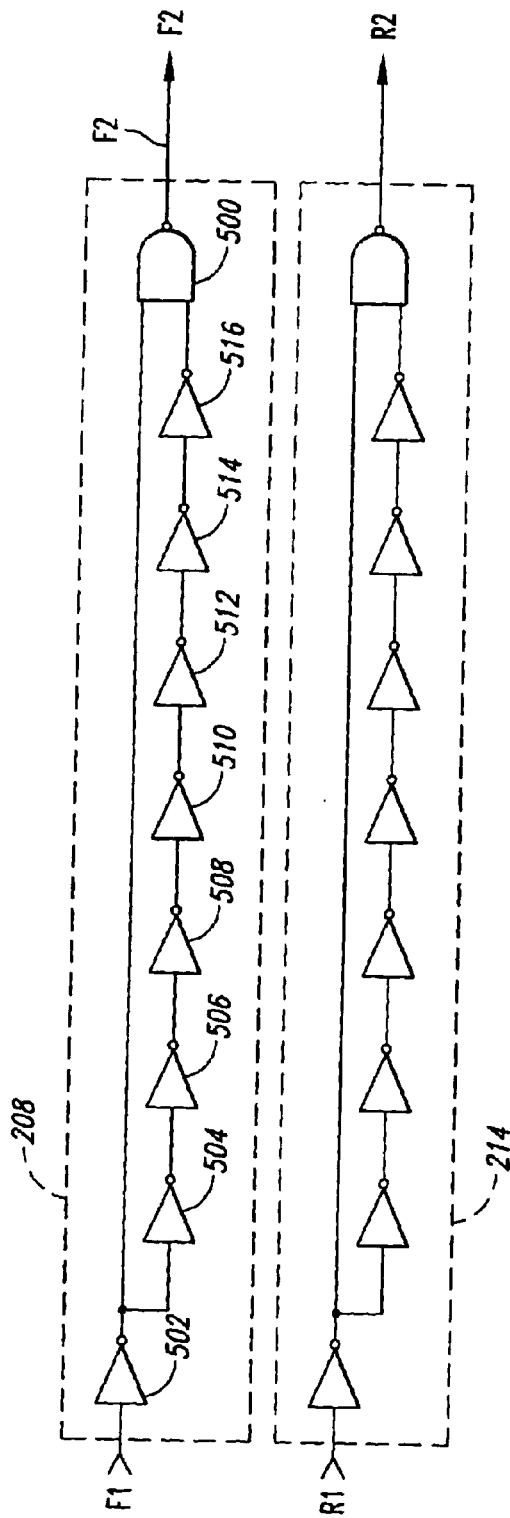
FIG. 5 is a schematic illustrating one embodiment of the pulse generation circuits in the differential input buffer of FIG. 2.

FIG. 5 is a schematic illustrating one embodiment of the pulse generation circuits 208 and 214 of FIG. 2. In the pulse generation circuit 208, the F1 signal is applied to a first input of a NAND gate 500 through an inverter 502, and is applied to a second input of the NAND gate through the inverter 502 and seven series-connected inverters 504–516. When the F1 signal is high, the inverter 502 applies a low signal to the first input of the NAND gate 500 which, in turn, drives the F2 signal inactive high. The low output from the inverter 502 is also applied through the series-connected inverters 504–516, causing the inverter 516 to drive its output high to thereby enable the NAND gate 500. When the F1 signal goes low, the inverter 502 drives its output high, and this high output is applied immediately to the NAND gate 500. At this point, the NAND gate 500 receives the high output from the inverter 502 and the high output from the inverter 516 and drives the F2 signal low. The output from the inverter 516 does not immediately go low in response to the output from the inverter 502 going high due to the delay in the high output from the inverter 502 in propagating through the series-connected inverters 504–516. As a result, the NAND gate 500 drives the F2 signal low for the time determined by the delay of the output of inverter 502 in propagating through the series-connected inverters 504–516. Once the inverter 516 drives its output low in response to the high output from the inverter 502, the NAND gate 500 drives the F2 signal high, terminating the low pulse of the F2 signal. More or fewer series-connected inverters may be utilized to adjust the duration of the low pulse of the F2 signal, as will be appreciated by those skilled in the art.

Figure 6:
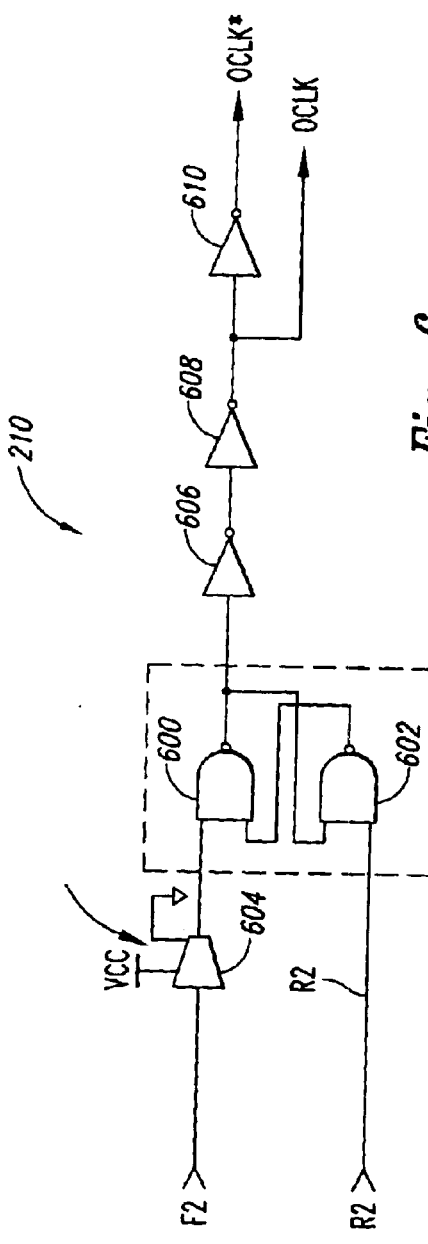
FIG. 6 is a schematic illustrating one embodiment of the waveform generation circuit in the differential input buffer of FIG. 2.

FIG. 6 is a schematic illustrating one embodiment of the waveform generation circuit 210 of FIG. 2. The waveform generation circuit 210 includes a pair of cross-coupled NAND gates 600 and 602 that form an RS latch, with the R2 signal being applied to a reset input of the latch and the F2 signal being applied through an enabled transmission gate 604 to a set input of the latch. The transmission gate 604 introduces a delay such that the delay between output of the NAND gate 600 being set responsive to the F2 signal is the same as the delay between the output of the NAND gate 600 being reset in response to the R2 signal. The output of the NAND gate 600 corresponds to the output of the latch and is applied through series-connected inverters 606 and 608 to generate the OCLK signal. In the embodiment of FIG. 6, the OCLK signal is also shown as being applied through an inverter 610 to develop a complementary output clock signal OCLK*.

In operation, when the F2 signal goes low the NAND gate 600 drives its output high, and this high output is applied through inverters 606 and 608 to generate a rising edge of the OCLK signal. During operation of the pulse generation circuit 210, only one of the signals F2 and R2 may be active low at a time. When the R2 signal goes low the NAND gate 602 drives its output high, applying two high inputs (the F2 signal is high at this point) to the NAND gate 600 which, in turn, drives its output low. The low output from the NAND gate 600 is applied through the inverters 606 and 608 to generate a falling edge of the OCLK signal. Note that the delay between the R2 going low and the NAND gate 600 driving its output low in response to this R2 signal is determined by the delays of both NAND gates 600 and 602. This is true because first the NAND gate 602 drives its output high in response to the low R2 signal, and the NAND gate 600 and thereafter drives its output low responsive to the high input from the NAND gate 602. Thus, the delay between the R2 signal going active low and the NAND gate 600 driving its output low in response thereto is given by two gate delays, namely the gate delays of the NAND gates 602 and 600. The transmission gate 604 is included so that the delay between the F2 signal going active low and the NAND gate 600 driving its output high in response thereto is also approximately equal to two gate delays. The transmission gate 604 is thus included merely to introduce a gate delay corresponding to the gate delay introduced by each of the NAND gates 600, 602, as will be appreciated by those skilled in the art. If the transmission gate 604 was not included, there would be only one gate delay between the F2 signal going active low and the AND gate 600 driving its output high in response to that signal, namely the gate delay of the NAND gate 600.

Figure 7:
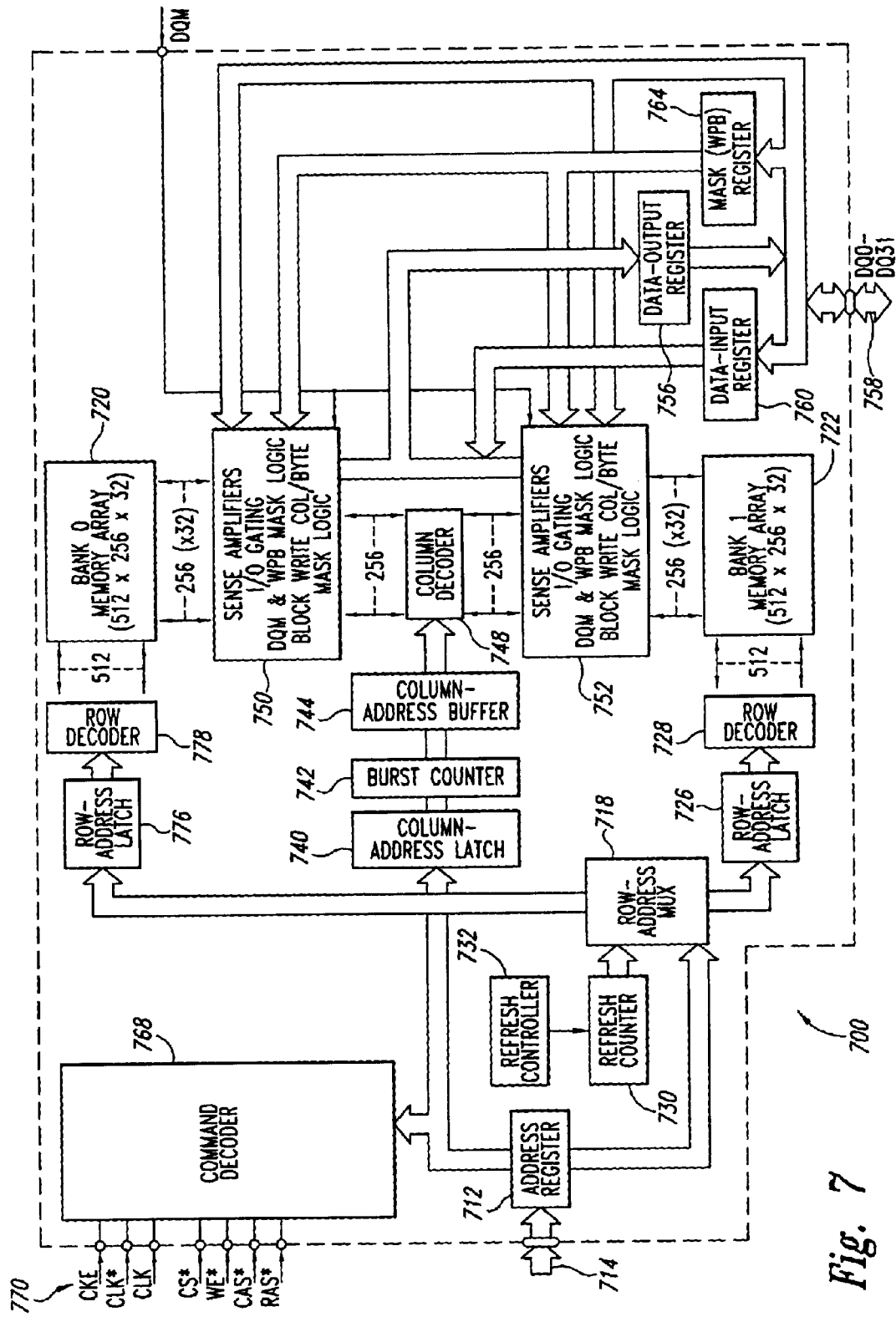
FIG. 7 is a functional block diagram of a memory device including the differential input buffer of FIG. 2.

The differential input buffer 200 can be used in a wide variety of digital circuits, including a memory device 700 as shown in FIG. 7. The memory device 700 illustrated therein is a synchronous dynamic random access memory ("SDRAM"), although the invention can be embodied in other types of synchronous DRAMs, such as packetized DRAMs and RAMBUS DRAMs (RDRAMS"), as well as other types of digital devices. The SDRAM 700 includes a command decoder 768 that controls the operation of various components within the SDRAM during operation. The command decoder 768 generates control signals responsive to command signals received on a control bus 770, with these command signals including complementary clock signals CLK, CLK* that are received by a differential input buffer 200 (not shown in FIG. 7) contained in the command decoder. A memory controller (not shown) typically generates these commands signals, which typically include a clock enable signal CKE*, a chip select signal CS*, a write enable signal WE*, a row address strobe signal RAS*, and a column address strobe signal CAS*, in addition to the CLK, CLK* signals.

The SDRAM 700 further includes an address register 712 that receives either a row address or a column address on an address bus 714, which is generally coupled to the memory controller (not shown). Typically, a row address is initially received by the address register 712 and applied to a row address multiplexer 718. The row address multiplexer 718 couples the row address to a number of components associated with either of two memory banks 720, 722 depending upon the state of a bank address bit forming part of the row address. Associated with each of the memory banks 720, 722 is a respective row address latch 726, which stores the row address, and a row decoder 728, which applies various signals to its respective array 720 or 722 as a function of the stored row address. The row address multiplexer 718 also couples row addresses to the row address latches 726 for the purpose of refreshing the memory cells in the arrays 720, 722. The row addresses are generated for refresh purposes by a refresh counter 730, which is controlled by a refresh controller 732.

After the row address has been applied to the address register 712 and stored in one of the row address latches 726, a column address is applied to the address register 712. The address register 712 couples the column address to a column address latch 740. Depending on the operating mode of the SDRAM 700, the column address is either coupled through a burst counter 742 to a column address buffer 744, or to the burst counter 742 which applies a sequence of column addresses to the column address buffer 744 starting at the column address output by the address register 712. In either case, the column address buffer 744 applies a column address to a column decoder 748 which applies various signals to respective sense amplifiers and associated column circuitry 750, 752 for the respective arrays 720, 722.

Figure 1:
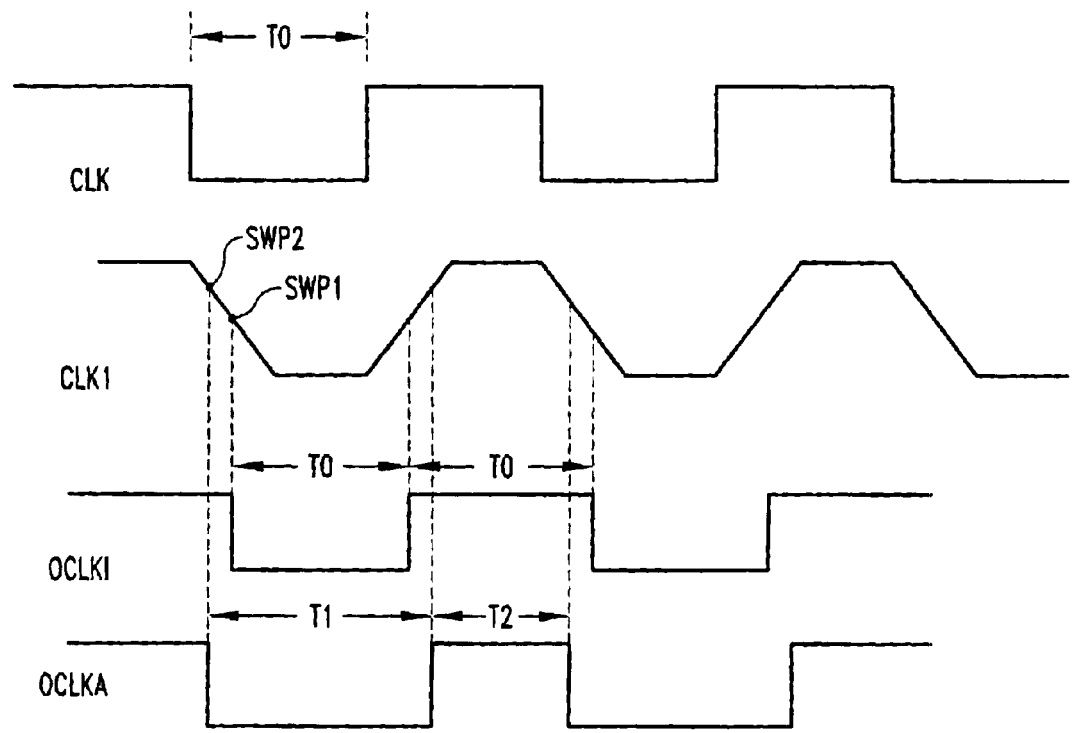
FIG. 1 is a signal timing diagram illustrating duty cycle skew that can occur in an input buffer that receives complementary input signals.

Data to be read from one of the arrays 720, 722 is coupled to the column circuitry 750, 752 for one of the arrays 720, 722, respectively. The data is then coupled through a read data path 754 to a data output register 756, which applies the data to a data bus 758. Data to be written to one of the arrays 720, 722 is coupled from the data bus 758 through one of the input buffers 10, 100 (FIGS. 1, 2, respectively), a data input register 760 and a write data path 762 to the column circuitry 750, 752 where it is transferred to one of the arrays 720, 722, respectively. A mask register 764 may be used to selectively alter the flow of data into and out of the column circuitry 750, 752, such as by selectively masking data to be read from the arrays 720, 722. In addition to the CLK, CLK* signals, other signals received by the SDRAM 700 or other digital circuit could also be received through respective differential input buffers 200, as will be appreciated by those skilled in the art.

As previously mentioned, the above-described operation of the SDRAM 700 is controlled by the command decoder 768 responsive to command signals received on the control bus 770. Various combinations of these signals are registered as respective commands, such as a read command or a write command. The command decoder 768 generates a sequence of control signals responsive to the command signals to carry out the function (e.g., a read or a write) designated by each of the command signals. These command signals, and the manner in which they accomplish their respective functions, are conventional. Therefore, in the interest of brevity, a further explanation of these control signals will be omitted.

Figure 8:
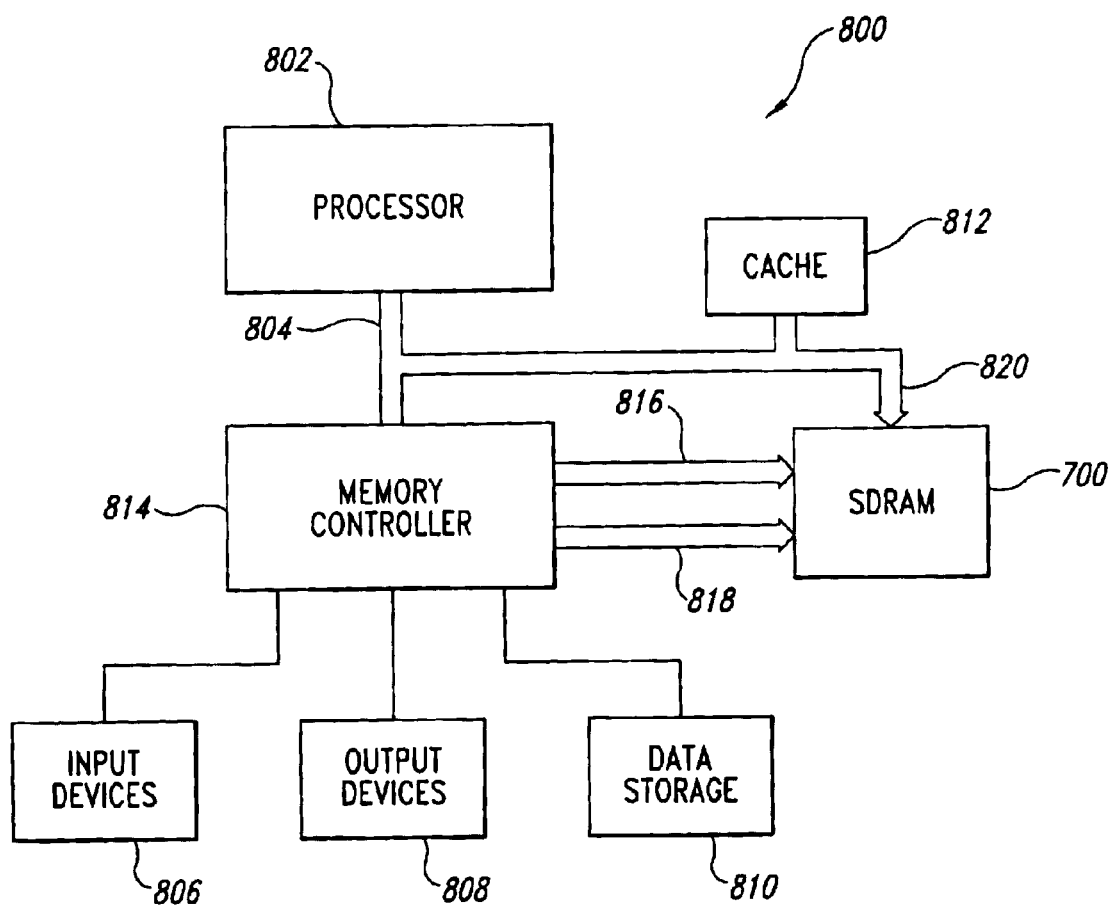
FIG. 8 is a functional block diagram of a computer system including the memory device of FIG. 6.

FIG. 8 shows a computer system 800 containing the SDRAM 700 of FIG. 7. The computer system 800 includes a processor 802 for performing various computing functions, such as executing specific software to perform specific calculations or tasks. The processor 802 includes a processor bus 804 that normally includes an address bus, a control bus, and a data bus. In addition, the computer system 800 includes one or more input devices 806, such as a keyboard or a mouse, coupled to the processor 802 to allow an operator to interface with the computer system 800. Typically, the computer system 800 also includes one or more output devices 808 coupled to the processor 802, such output devices typically being a printer or a video terminal. One or more data storage devices 810 are also typically coupled to the processor 802 to allow the processor to store data in or retrieve data from internal or external storage media (not shown). Examples of typical storage devices 810 include hard and floppy disks, tape cassettes, and compact disk read-only memories (CD-ROMs). The processor 802 is also typically coupled to cache memory 812, which is usually static random access memory ("SRAM"), and to the SDRAM 700 through a memory controller 814. The memory controller 814 normally includes a control bus 816 and an address bus 818 that are coupled to the SDRAM 700. A data bus 820 is coupled from the SDRAM 700 to the processor bus 804 either directly (as shown), through the memory controller 814, or by some other means.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An input buffer, comprising:
a first differential amplifier having a positive input adapted to receive an input signal, a negative input adapted to receive a complementary input signal, and an output, the differential amplifier operable to drive a buffer signal on the output from a first logic state to a second logic state at a first slew rate responsive to the input signal transitioning from a first logic state to a second logic state and the complementary input signal transitioning from the second logic state to the first logic state, and the differential amplifier operable to drive the buffer signal from the second logic state to the first logic state at a second slew rate responsive to the input signal transitioning from the second logic state to the first logic state and the complementary input signal transitioning from the first logic state to the second logic state;

a second differential amplifier having a positive input adapted to receive the complementary input signal, a negative input adapted to receive the input signal, and an output, the differential amplifier operable to drive a buffer signal on the output from a first logic state to a second logic state at the first slew rate responsive to the input signal transitioning from a first logic state to a second logic state and the complementary input signal transitioning from the second logic state to the first logic state, and the differential amplifier operable to drive the buffer signal from the second logic state to the first logic state at the second slew rate responsive to the input signal transitioning from the second logic state to the first logic state and the complementary input signal transitioning from the first logic state to the second logic state; and an output circuit coupled to the outputs of the first and second differential amplifiers, the output circuit operable to generate a first edge of an output signal responsive to the buffer signal from the first differential amplifier transitioning from the first logic state to the second logic state and operable to generate a second edge of an output signal responsive to the buffer signal from the second differential amplifier transitioning from the first logic state to the second logic state.

2. The input buffer of claim 1 wherein the input and complementary input signals comprise complementary clock signals.

3. The input buffer of claim 1 wherein first and second logic states of the buffer signals comprise high and low logic states, respectively.

4. The input buffer of claim 3 wherein the first and second logic states of the input signal comprise high and low logic states, respectively.

5. The input buffer of claim 4 wherein the first edge of the output signal corresponds to a rising edge and wherein the second edge of the output signal corresponds to a falling edge.

6. The input buffer of claim 1 wherein the output circuit comprises:
a first pulse generation circuit coupled to the first differential amplifier and operable to develop a first output pulse responsive to the buffer signal transitioning from the first logic state to the second logic state;
a second pulse generation circuit coupled to the second differential amplifier operable to develop a second output pulse responsive to the buffer signal transitioning from the first logic state to the second logic state; and
a waveform generation circuit coupled to the first and second pulse generation circuits, the waveform generation circuit operable to develop a first edge of the output signal responsive to the pulse from the first pulse generation circuit and operable to develop a second edge of the output signal responsive to the pulse from the second pulse generation circuit.

7. The input buffer of claim 6 wherein the waveform generation circuit comprises an RS flip-flop.

8. The input buffer of claim 6 wherein each pulse generation circuit comprises:

a NAND gate having a first input coupled to the output of the corresponding differential amplifier, and having a second input and an output; and an odd number of series-connected inverters, an input of the first inverter being coupled to the output of the corresponding differential amplifier and an output of the last inverter being coupled to the second input of the NAND gate.

9. An input buffer circuit, comprising:

a first differential amplifier having a positive input adapted to receive an input signal and a negative input adapted to receive a complementary input signal, and having an output;

a second differential amplifier having a positive input coupled to the negative input of the first differential amplifier and a negative input coupled to the positive input of the first differential amplifier, and having an output;

a first pulse generation circuit coupled to the output of the first differential amplifier;

a second pulse generation circuit coupled to the output of the second differential amplifier;

a waveform generation circuit coupled to the pulse generation circuits;

a first buffer coupled between the first differential amplifier and the first pulse generation circuit; and a second buffer coupled between the second differential amplifier and the second pulse generation circuit.

10. The input buffer circuit of claim 9 wherein each pulse generation circuit comprises:

a NAND gate having a first input coupled to the output of the corresponding differential amplifier, and having a second input and an output; and an odd number of series-connected inverters, an input of the first inverter being coupled to the output of the corresponding differential amplifier and an output of the last inverter being coupled to the second input of the NAND gate.

11. The input buffer circuit of claim 9 wherein the waveform generation circuit comprises:

a transmission gate having an input coupled to one of the pulse generation circuits, and having an output and a control inputs coupled to activate the transmission gate;

an RS latch having a set input coupled to the output of the transmission gate, and having a reset input coupled to the other one of the pulse generation circuits, and having an output.

12. An input buffer, comprising:

a first amplifying means for driving a buffer signal from a first logic state to a second logic state at a first slew rate responsive to an input signal transitioning from a first logic state to a second logic state and a complementary input signal transitioning from the second logic state to the first logic state, and for driving the buffer signal from the second logic state to the first logic state at a second slew rate responsive to the input signal transitioning from the second logic state to the first logic state and the complementary input signal transitioning from the first logic state to the second logic state;

a second amplifying means for driving a buffer signal from a first logic state to a second logic state at the first slew rate responsive to the input signal transitioning from a first logic state to a second logic state and the complementary input signal transitioning from the second logic state to the first logic state, and for driving the buffer signal from the second logic state to the first logic state at the second slew rate responsive to the input signal transitioning from the second logic state to the first logic state and the complementary input signal transitioning from the first logic state to the second logic state; and output means for generating a first edge of an output signal responsive to the buffer signal from the first amplifying means transitioning from the first logic state to the second logic state and for generating a second edge of an output signal responsive to the buffer signal from the second amplifying means transitioning from the first logic state to the second logic state.

13. The input buffer of claim 12 wherein the input and complementary input signals comprise complementary clock signals.

14. The input buffer of claim 12 wherein first and second logic states of the buffer signals comprise high and low logic states, respectively.

15. The input buffer of claim 14 wherein the first and second logic states of the input signal comprise high and low logic states, respectively.

16. The input buffer of claim 15 wherein the first edge of the output signal corresponds to a rising edge and wherein the second edge of the output signal corresponds to a falling edge.

17. A memory device, comprising:

an address bus;

a control bus;

a data bus;

an address decoder coupled to the address bus;

a read/write circuit coupled to the data bus;

a control circuit coupled to the control bus;

a memory-cell array coupled to the address decoder, control circuit, and read/write circuit; and an input buffer contained in at least one of the read/write circuit, address decoder, and control circuit, the input buffer including, a first differential amplifier having a positive input adapted to receive an input signal, a negative input adapted to receive a complementary input signal, and an output, the differential amplifier operable to drive a buffer signal on the output from a first logic state to a second logic state at a first slew rate responsive to the input signal transitioning from a first logic state to a second logic state and the complementary input signal transitioning from the second logic state to the first logic state, and the differential amplifier operable to drive the buffer signal from the second logic state to the first logic state at a second slew rate responsive to the input signal transitioning from the second logic state to the first logic state and the complementary input signal transitioning from the first logic state to the second logic state;

a second differential amplifier having a positive input adapted to receive the complementary input signal, a negative input adapted to receive the input signal, and an output, the differential amplifier operable to drive a buffer signal on the output from a first logic state to a second logic state at the first slew rate responsive to the input signal transitioning from a first logic state to a second logic state and the complementary input signal transitioning from the second logic state to the first logic state, and the differential amplifier operable to drive the buffer signal from the second logic state to the first logic state at the second slew rate responsive to the input signal transitioning from the second logic state to the first logic state and the complementary input signal transitioning from the first logic state to the second logic state; and an output circuit coupled to the outputs of the first and second differential amplifiers, the output circuit operable to generate a first edge of an output signal responsive to the buffer signal from the first differential amplifier transitioning from the first logic state to the second logic state and operable to generate a second edge of an output signal responsive to the buffer signal from the second differential amplifier transitioning from the first logic state to the second logic state.

18. The memory device of claim 17 wherein the input and complementary input signals comprise complementary clock signals.

19. The memory device of claim 17 wherein first and second logic states of the buffer signals comprise high and low logic states, respectively.

20. The memory device of claim 19 wherein the first and second logic states of the input signal comprise high and low logic states, respectively.

21. The memory device of claim 20 wherein the first edge of the output signal corresponds to a rising edge and wherein the second edge of the output signal corresponds to a falling edge.

22. The memory device of claim 17 wherein the output circuit comprises:

a first pulse generation circuit coupled to the first differential amplifier and operable to develop a first output pulse responsive to the buffer signal transitioning from the first logic state to the second logic state;

a second pulse generation circuit coupled to the second differential amplifier operable to develop a second output pulse responsive to the buffer signal transitioning from the first logic state to the second logic state; and a waveform generation circuit coupled to the first and second pulse generation circuits, the waveform generation circuit operable to develop a first edge of the output signal responsive to the pulse from the first pulse generation circuit and operable to develop a second edge of the output signal responsive to the pulse from the second pulse generation circuit.

23. The memory device of claim 22 wherein the waveform generation circuit comprises an RS flip-flop.

24. The memory device of claim 22 wherein each pulse generation circuit comprises:

a NAND gate having a first input coupled to the output of the corresponding differential amplifier, and having a second input and an output; and an odd number of series-connected inverters, an input of the first inverter being coupled to the output of the corresponding differential amplifier and an output of the last inverter being coupled to the second input of the NAND gate.

25. The memory device of claim 17 wherein the memory device comprises a DDR SDRAM.

26. A computer system, comprising:
a data input device;
a data output device;
a processor coupled to the data input and output devices; and a memory device coupled to the processor, the memory device comprising,
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit; and
an input buffer contained in at least one of the read/write circuit, address decoder, and control circuit, the input buffer including,
a first differential amplifier having a positive input adapted to receive an input signal, a negative input adapted to receive a complementary input signal, and an output, the differential amplifier operable to drive a buffer signal on the output from a first logic state to a second logic state at a first slew rate responsive to the input signal transitioning from a first logic state to a second logic state and the complementary input signal transitioning from the second logic state to the first logic state, and the differential amplifier operable to drive the buffer signal from the second logic state to the first logic state at a second slew rate responsive to the input signal transitioning from the second logic state to the first logic state and the complementary input signal transitioning from the first logic state to the second logic state;

a second differential amplifier having a positive input adapted to receive the complementary input signal, a negative input adapted to receive the input signal, and an output, the differential amplifier operable to drive a buffer signal on the output from a first logic state to a second logic state at the first slew rate responsive to the input signal transitioning from a first logic state to a second logic state and the complementary input signal transitioning from the second logic state to the first logic state, and the differential amplifier operable to drive the buffer signal from the second logic state to the first logic state at the second slew rate responsive to the input signal transitioning from the second logic state to the first logic state and the complementary input signal transitioning from the first logic state to the second logic state; and an output circuit coupled to the outputs of the first and second differential amplifiers, the output circuit operable to generate a first edge of an output signal responsive to the buffer signal from the first differential amplifier transitioning from the first logic state to the second logic state and operable to generate a second edge of an output signal responsive to the buffer signal from the second differential amplifier transitioning from the first logic state to the second logic state.

27. The computer system of claim 26 wherein the input and complementary input signals comprise complementary clock signals.

28. The computer system of claim 26 wherein first and second logic states of the buffer signals comprise high and low logic states, respectively.

29. The computer system of claim 28 wherein the first and second logic states of the input signal comprise high and low logic states, respectively.

30. The computer system of claim 29 wherein the first edge of the output signal corresponds to a rising edge and wherein the second edge of the output signal corresponds to a falling edge.

31. The computer system of claim 26 wherein the output circuit comprises:
   a first pulse generation circuit coupled to the first differential amplifier and operable to develop a first output pulse responsive to the buffer signal transitioning from the first logic state to the second logic state;
   a second pulse generation circuit coupled to the second differential amplifier operable to develop a second output pulse responsive to the buffer signal transitioning from the first logic state to the second logic state; and
   a waveform generation circuit coupled to the first and second pulse generation circuits, the waveform generation circuit operable to develop a first edge of the output signal responsive to the pulse from the first pulse generation circuit and operable to develop a second edge of the output signal responsive to the pulse from the second pulse generation circuit.

32. The computer system of claim 31 wherein the waveform generation circuit comprises an RS flip-flop.

33. The computer system of claim 31 wherein each pulse generation circuit comprises:
   a NAND gate having a first input coupled to the output of the corresponding differential amplifier, and having a second input and an output; and
   an odd number of series-connected inverters, an input of the first inverter being coupled to the output of the corresponding differential amplifier and an output of the last inverter being coupled to the second input of the NAND gate.

34. The computer system of claim 26 wherein the memory device comprises a DDR SDRAM.

35. A method of generating an internal clock signal in response to an input clock signal and a complementary input clock signal, the method comprising:
   generating a transition of a first clock signal responsive to a rising or falling edge of the input clock signal and corresponding edge of the complementary input clock signal;
   generating a transition of a second clock signal responsive to the other edge of the input clock signal and corresponding edge of the complementary input clock signal, the transition of the second clock signal being the same as the transition of the first clock signal;
   generating a first pulse signal responsive to the transition of the first clock signal;
   generating a second pulse signal responsive to the transition of the second clock signal;
   generating a rising or falling edge of an output clock signal responsive to the first pulse signal; and
   generating the other edge of the output clock signal responsive to the second pulse signal.

36. The method of claim 35 wherein the transition of the first and second clock signals comprises a falling edge of each clock signal.

37. The method of claim 35 wherein the first clock signal is generated responsive to a falling edge of the input clock signal and a rising edge of the complementary input clock signal, and the wherein the second clock signal is generated responsive to a rising edge of the input clock signal and a falling edge of the complementary input clock signal.

38. The method of claim 35 wherein a slew rate of the transitions of the first and second clock signals is equal, and wherein each of the pulse signals is generated responsive to the corresponding first or second clock signal having a threshold value.

39. A method of generating an internal clock signal in response to an input clock signal and a complementary input clock signal, the method comprising:
   applying the input clock signal to a positive input of a first differential amplifier and the complementary clock signal to a negative input of the first differential amplifier;
   applying the input clock signal to a negative input of a second differential amplifier and the complementary clock signal to a positive input of the second differential amplifier,
   generating a first pulse signal responsive to a transition of an output signal from the first differential amplifier;
   generating a second pulse signal responsive to a transition of an output signal from the second differential amplifier, the transition of the output signal from the second differential amplifier being the same type of transition as the output signal from the first differential amplifier; and
   generating an output clock signal responsive to the first and second pulse signals.

40. The method of claim 39 wherein the transition of the output signals from the first and second differential amplifiers comprises a falling edge of each output signal.

41. The method of claim 39 wherein generating an output clock signal comprises generating a falling edge of the output clock signal responsive to the first pulse signal and generating the rising edge of the output clock signal responsive to the second pulse signal.

42. An input buffer circuit, comprising:
   a first differential amplifier having a positive input adapted to receive an input signal and a negative input adapted to receive a complementary input signal, and having an output;
   a second differential amplifier having a positive input coupled to the negative input of the first differential amplifier and a negative input coupled to the positive input of the first differential amplifier, and having an output;
   a first pulse generation circuit coupled to the output of the first differential amplifier,
   a second pulse generation circuit coupled to the output of the second differential amplifier, and
   a waveform generation circuit coupled to the pulse generation circuits, the waveform generation circuit comprising:
      a transmission gate having an input coupled to one of the pulse generation circuits, and having an output and a control inputs coupled to activate the transmission gate; and
      an RS latch having a set input coupled to the output of the transmission gate, and having a reset input coupled to the other one of the pulse generation circuits, and having an output.

43. The input buffer circuit of claim 42 wherein each pulse generation circuit comprises:
   a NAND gate having a first input coupled to the output of the corresponding differential amplifier, and having a second input and an output; and
   an odd number of series-connected inverters, an input of the first inverter being coupled to the output of the corresponding differential amplifier and an output of the last inverter being coupled to the second input of the NAND gate.

* * * * *

UNITED STATES PATENT AND TRADEMARK OFFICE
CERTIFICATE OF CORRECTION

PATENT NO. : 6,847,582 B2
APPLICATION NO. : 10/387150
DATED : January 25, 2005
INVENTOR(S) : Dong Pan It is certified that error appears in the above-identified patent and that said Letters Patent is hereby corrected as shown below:

| Column, Line | Reads | Should Read |
|---|---|---|
| Item (57), Line 4 | "rate when input signal" | --rate when an input signal-- |
| Item (57), Line 13 | "a second edged" | --a second edge-- |
| Column 1, Line 7 | "characteristics input" | --characteristics of input-- |
| Column 1, Line 48 | "differential amplifiers" | --differential amplifier-- |
| Column 4, Line 7 | "signal being show in" | --signal being shown in-- |
| Column 4, Line 59 | "Teaches the switch point" | --reaches the switch point-- |
| Column 5, Line 60 | "to the delayed" | --to be delayed-- |
| Column 6, Line 57 | "components 4436-452" | --components 436-452-- |
| Column 7, Line 42 | "output high, and this high" | --output high, this high-- |
| Column 8, Line 4 | "low and the AND gate" | --low and the NAND gate-- |
| Column 8, Line 13 | "DRAMs (RDRAMS")," | --DRAMs ("RDRAMs"),-- |
| Column 9, Line 8 | "digital circuit could also" | --digital circuits could also-- |
| Column 11, Line 45 | "control inputs" | --control input-- |

UNITED STATES PATENT AND TRADEMARK OFFICE
CERTIFICATE OF CORRECTION

PATENT NO. : 6,847,582 B2
APPLICATION NO. : 10/387150
DATED : January 25, 2005
INVENTOR(S) : Dong Pan It is certified that error appears in the above-identified patent and that said Letters Patent is hereby corrected as shown below:

| Column, Line | Reads | Should Read |
|---|---|---|
| Column 16, Line 44 | "amplifier, and" | --amplifier; and-- |

Signed and Sealed this

Twenty-sixth Day of December, 2006

JON W. DUDAS
*Director of the United States Patent and Trademark Office*